United States Patent [19]

Zell et al.

[11] Patent Number: 4,896,248
[45] Date of Patent: Jan. 23, 1990

[54] MODULE FRAME FOR RECEIVING INSERTABLE ELECTRICAL PRINTED CIRCUIT BOARDS

[75] Inventors: Karl Zell, Niederpoecking; Egon Jaeger, Munich; Peter Stoerk, Eurasburg; Guenther Steiner, Munich, all of Fed. Rep. of Germany

[73] Assignee: Siemens Aktiengesellschaft, Berlin and Munich, Fed. Rep. of Germany

[21] Appl. No.: 368,169

[22] Filed: Jun. 16, 1989

Related U.S. Application Data

[63] Continuation of Ser. No. 191,068, May 6, 1988, abandoned.

[30] Foreign Application Priority Data

Jul. 15, 1987 [DE] Fed. Rep. of Germany ....... 3723395

[51] Int. Cl.⁴ .......................................... H05K 07/14
[52] U.S. Cl. .................................... 361/415; 361/413; 361/429
[58] Field of Search .................. 211/41; 361/380, 395, 361/399, 413, 415, 429

[56] References Cited

U.S. PATENT DOCUMENTS

| | | | |
|---|---|---|---|
| 3,733,523 | 5/1973 | Reynolds et al. | 361/415 |
| 4,563,722 | 1/1986 | Maroney et al. | 361/424 |

FOREIGN PATENT DOCUMENTS

| | | | |
|---|---|---|---|
| 0236799 | 9/1987 | European Pat. Off. | 361/415 |
| 3309489 | 9/1984 | Fed. Rep. of Germany | 361/399 |
| 1508832 | 4/1978 | United Kingdom | 361/415 |

Primary Examiner—Gregory D. Thompson
Attorney, Agent, or Firm—Hill, Van Santen, Steadman & Simpson

[57] ABSTRACT

A module frame receives insertable electrical printed circuit boards equipped with components that are connected to one another, in their inserted condition with plug connectors by way of a motherboard. A prescribed plurality of guides are arranged under one another in the module frame at defined intervals so that the printed circuit boards, having a height less than the height of the module frame, are insertable into the module frame.

4 Claims, 1 Drawing Sheet

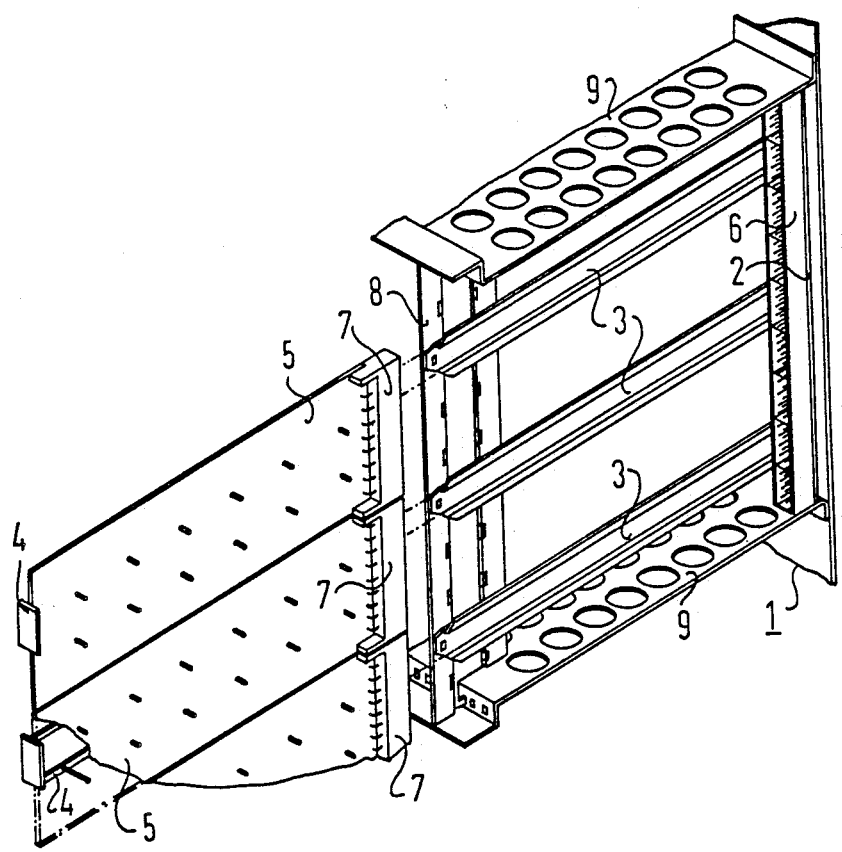

MODULE FRAME FOR RECEIVING INSERTABLE ELECTRICAL PRINTED CIRCUIT BOARDS

This is a continuation of application Ser. No. 191,068 filed 5/6/88, now abandoned.

FIELD OF THE INVENTION

The present invention is directed to a module frame for receiving insertable electrical printed circuit (PC) boards equipped with components that are connected to one another in the inserted condition with plug connectors by way of a motherboard.

DESCRIPTION OF THE PRIOR ART

Such module frames, into which electrical PC boards are inserted are universally known. The individual PC boards are inserted in a vertical position in such module frames. The dimensions of the PC boards thereby essentially correspond to the height and the depth of the module frame. Given utilization in variable systems or, respectively, in overall systems that can be expanded in stages, this structure of a module frame comprising insertable electrical PC boards leads to a number of disadvantages. One of these disadvantages is that the prescribed dimensions of the PC boards do not make possible an optimum adaptation to the respective size of the existing system. Therefore, the permanently-prescribed dimensions of the PC boards lead either to over-equipping or to under-equipping of the module frame.

A further disadvantage is that it is frequently necessary to resolve larger circuit complexes into smaller, pluggable units. This is usually carried out by division onto a plurality of insertable, electrical PC boards that are connected to one another via a motherboard. When, however, extremely small circuit complexes are thereby interchangeably arranged, then these are arranged to be pluggable on the components side of the PC boards, as what are referred to as sub-assemblies. Since the PC boards are usually arranged vertically parallel and side-by-side in the module frame at a relatively small distance from one another, the problem arises that the entire PC board must be pulled for the replacement of one component or, respectively, of one sub-assembly and, therefore, must be placed out of operation.

SUMMARY OF THE INVENTION

The object of the present invention is to provide a module frame of a type generally set forth above, that enables an optimum adaptation of the component-equippable surfaces of the electrical PC boards to the respective requirements of a particular system.

In a module frame of the aforementioned type, this object is achieved, according to the present invention, in that a prescribed plurality of horizontally-extending guides are arranged under one another within the module frame at defined spaced intervals parallel to the plug-in planes of the PC boards, and in that, corresponding to the plurality of guides, PC boards provided with guide frames fitting onto the guides and having a size adapted to the spacing of the guides, can be connected to the motherboard with plug connectors independently of one another.

As a result of the introduction of printed circuit boards of different sizes, i.e., of PC boards whose dimensions no longer only essentially correspond to the height and to the depth of the module frame, the module frame of the present invention makes an optimum adaptation of the surface equippable with the components possible within a larger system, respectively, dependent on the configuration level of the system. An additional advantage that derives, given the module frame of the present invention, is comprised therein that, given an outage of certain electrical components, smaller down units occur. This provides that an unnecessarily large number of functional units need not be replaced in case of malfunction.

According to an advantageous feature of the invention, the module frame of the present invention is particularly characterized in that the height of the individual assemblies amounts to the single or multiple length of a defined module stage length of the plug connection.

Modern plug connectors are modularly constructed whereby the module stage corresponds in length to a System Unit (SU) equal to 25 mm. This corresponds to the multi-module of 25 mm according to the DIN Standard 43355. An adaptation to different PC board heights is possible with spring clips having a length of 1.4 and 9 SU, so that an architecture adapted to the application can be produced in a simple manner.

BRIEF DESCRIPTION OF THE DRAWING

Other objects, features and advantages of the invention, its organization, construction and operation will be best understood from the following detailed description, taken in conjunction with the accompanying drawing, on which there is a single figure, which is a perspective view of a portion of a module frame constructed in accordance with the present invention.

DESCRIPTION OF THE PREFERRED EMBODIMENT

Referring to the drawing, there is a perspective view of a module frame 1 constructed in accordance with the present invention and also illustrating parts of PC boards 5 insertable thereinto. Only those portions of the module frame 1 or, respectively, of the PC boards 5, required for an understanding of the invention, are shown in the illutration of the exemplary embodiment.

In the illustrated exemplary embodiment, the module frame 1 (only partially shown) is essentially composed of two metallic perforated plates 9 that limit the module 1 at the top and bottom and is further composed of a motherboard 2 that limits the module frame at its rear. In the illustrated example, three guides 3 arranged spaced under one another are provided, these, for example, being composed of profiled metal rails. Corresponding to the width of the module frame, further guides can be arranged parallel to the guides 3 shown on the drawing. The construction of the module frame 1 need not be necessarily limited to three guides arranged under one another as illustrated, but may have two guides or, on the other hand, may have more than three guides spaced under one another.

In the illustrated exemplary embodiment, the guides 3 are secured to the front side of the module frame 1 at perpendicularly-extending reinforcing rails 8, whereas the rear ends of the guides 3 are held in the motherboard 2.

Correspondingly-dimensioned PC boards 5 are insertable into the module frame 1 with the assistance of the guides 3. The individual PC boards 5 have coresponding guide frames 4 attached thereto that are constructed corresponding and complementary to the guides 3. At its end, every PC boad 5 has a plug part 7 comprising a plug connector adapted to the height of the PC board 5. In the illustrated exemplary embodiment, it is thereby a matter of a plug part having integrated contact springs. A centering strip 6 on the motherboard serves as a cooperating member that is slipped onto the contact blade of the motherboard 2 and, therefore, serves as a receptacle for the contact springs.

Such centering strips are usually sub-divided into a plurality of sections of identical size. It is, therefore, convenient when dimensioning height of the PC boards 5 to use the size of the sections of the centering strip 6 as the basis for such dimensioning.

It should be pointed out in this context that two guides can also be provied for one PC board, given a defined size of a PC board, these being provided for reasons of stability.

Although we have described our invention by reference to particular illustrated embodiments thereof, many changes and modifications of the invention may become apparent to those skilled in the art without departing from the spirit and scope of the invention. We, therefore, intend to include within the patent warranted hereon all such changes and modifications as may reasonably and properly be included within the scope of our contribution to the art.

We claim:

1. A module frame receiving insertable electrical printed circuit boards equipped with components, which circuit boards are plugged into a motherboard in parallel planes and are connected to one another in their inserted condition with plug connectors by way of said motherboard, comprising:

a plurality of horizontally-extending guides arranged in a plurality of sets, each set having a plurality of guides arranged under one another within the module frame, the guides in each set defining a vertical plane, the guides in each set being spaced at intervals parallel to the planes of the printed circuit boards; and corresponding to at least one set of guides, at least one printed circuit board including at least one guide frame attached along a back surface of the circuit board operatively engaging one of the horizontally-extending guides; whereby said circuit board is connectible independently to the motherboard by way of at least one of the plug connects.

2. The module frame of claim 1, wherein:

said one plug connector has a defined module stage height and said one printed circuit board comprises a height which is at least as high as said defined module stage height of said one plug connector.

3. The module frame of claim 1, wherein:

said one plug connector has a defined module stage height and the height of said one printed circuit board amounts to a single or multiple of said defined module height of said one plug connector.

4. A module frame receiving insertable electrical printed circuit boards equipped with components, which circuit boards are plugged into a motherboard in parallel planes and are connected to one another in their inserted condition with plug connectors by way of said motherboard, comprising:

a plurality of horizontally-extending guides arranged in a plurality of sets within the module frame at defined spaced horizontal intervals, each guide set defining a vertical plane parallel to the plug-in planes of said printed circuit boards; and said plurality of printed circuit boards, each including at least one guide frame attached along a back side of the respective circuit board engaging at least one of the horizontally-extending guides of a guide set, each circuit board being connected independently of the other to the motherboard by way of at least one respective plug connector, each said plug connector having a defined module stage height, each of said printed circuit boards comprising a height which is one of a single or multiple of said defined module stage height of the respective plug connector.

* * * * *